(12) United States Patent
Weisz-Margulescu et al.

(10) Patent No.: US 7,126,063 B2
(45) Date of Patent: Oct. 24, 2006

(54) ENCAPSULATED ELECTRONIC SENSOR PACKAGE

(75) Inventors: Adam Weisz-Margulescu, Thornhill (CA); Alan Albino, Woodbridge (CA); Roger Robichaud, Newmarket (CA)

(73) Assignee: Tyco Electronics Canada, Ltd., Markham (CA)

( * ) Notice: Subject to any disclaimer, the term of this patent is extended or adjusted under 35 U.S.C. 154(b) by 310 days.

(21) Appl. No.: 10/673,898

(22) Filed: Sep. 29, 2003

(65) Prior Publication Data
US 2005/0068746 A1  Mar. 31, 2005

(51) Int. Cl.
*H01L 23/28* (2006.01)

(52) U.S. Cl. .............. 174/521; 116/208; 188/1.11 W; 361/752

(58) Field of Classification Search .......... 174/52.2, 174/52.3, 520, 521; 361/752; 116/204, 116/208, 209; 118/1.11 E, 1.11 L, 1.11 W
See application file for complete search history.

(56) References Cited

U.S. PATENT DOCUMENTS

| | | | |
|---|---|---|---|
| 3,256,382 A * | 6/1966 | Johnson et al. ............ 174/52.3 |
| 3,806,770 A * | 4/1974 | Voyles et al. ............... 174/52.2 |
| 3,909,504 A * | 9/1975 | Browne ..................... 174/52.2 |
| 4,223,177 A * | 9/1980 | Nakamura .................. 174/52.3 |
| 4,528,932 A * | 7/1985 | Ducza et al. ............... 116/204 |
| 4,694,119 A * | 9/1987 | Groenewegen ............ 174/52.2 |
| 4,712,420 A * | 12/1987 | Johansson et al. .......... 116/204 |
| 4,811,168 A * | 3/1989 | Chesnut et al. ............. 361/752 |
| 4,944,401 A * | 7/1990 | Groenewegen ............ 174/52.2 |
| 5,913,385 A | 6/1999 | Thibodeau |
| 6,030,118 A * | 2/2000 | Schneider et al. .......... 116/204 |
| 6,783,373 B1 * | 8/2004 | Hsu et al. ................... 361/752 |
| 6,872,880 B1 * | 3/2005 | King et al. ............... 174/35 R |
| 6,920,050 B1 * | 7/2005 | Little et al. ................. 361/752 |

\* cited by examiner

*Primary Examiner*—Dean A. Reichard
*Assistant Examiner*—Adolfo Nino

(57) ABSTRACT

An electronic package includes a circuit board and a capsule layer encasing the circuit board and forming an immersible electronic module. A housing receives the electronic module and forms a protective shell around the electronic module.

9 Claims, 6 Drawing Sheets

ENCAPSULATED ELECTRONIC SENSOR PACKAGE

BACKGROUND OF THE INVENTION

The invention relates generally to electronic packages, and, more particularly, to sealed electronic packages for use in rugged environmental conditions.

The proliferation of electronic devices in modern vehicles creates a number of manufacturing challenges in packaging the electronic devices to adequately protect electronic components and ensure reliable operation thereof. Especially for electronic packages which are mounted on the exterior of a vehicle, providing adequate protection for electronics can become a daunting task.

For example, electronic monitoring of brake wear for trucks, buses, and larger vehicles has become desirable to ensure proper performance of the vehicle and to comply with applicable regulations. By sensing an operating condition of the brakes for the vehicle or trailer, a warning signal may be provided to an operator of the vehicle, such as through a dashboard light or indicator, that one or more of the vehicle brakes should be serviced. Unacceptable or dangerous operating conditions may therefore be avoided, and inconvenient physical inspection of the brakes need not be as frequent.

To correctly monitor the condition of the brakes, the electronics and sensing mechanisms must be located underneath the vehicle near the brakes themselves, and are therefore exposed to varying temperature, pressure and moisture conditions, as well as exposed to a variety of engine fluids, lubricants, grease, brake fluids, debris, gravel, roadway composition coatings and by-products. Electronic components must therefore be carefully packaged to withstand such a harsh operating environment and reliably operate.

One known approach for protecting electronics from harsh environments is to contain the electronic components within a housing, and then fill or pack the housing with a silicon potting compound to insulate electronic components from adverse environmental conditions. The silicon potting compound, however, tends to result in bulky electronic packages. In one application for a brake wear monitor system, the housing of the electronic package must have a slim profile on the order of 0.5 inches or less. Achieving a profile such as this with silicon potting compounds is problematic. A suitable alternative to silicon potting compounds to protect electronic sensor packages is desirable.

BRIEF DESCRIPTION OF THE INVENTION

According to an exemplary embodiment, an electronic package comprises a circuit board and a capsule layer encasing the circuit board, thereby forming an immersible electronic module. A housing receives the electronic module and forms a protective shell around the electronic module.

Optionally, the capsule layer comprises a melt processsible rubber, and the housing comprises a longitudinal axis. An elongated opening extends transverse to the longitudinal axis in the housing for adjusting a position of the housing. The housing includes a mounting stud and at least one indicator bar.

According to another exemplary embodiment, an electronic package is provided. The package comprises an electronic assembly overmolded with a capsule layer, and the electronic assembly is configured to output a signal in response to a condition of a monitored object. A housing having a bore therein is configured to receive the overmolded electronic assembly, and one of the capsule layer and the housing comprises a latch configured to engage the other of the capsule layer and the housing.

According to another exemplary embodiment, a method of packaging an electronic assembly subject to a severe operating environment is provided. The method comprises encapsulating the electronic assembly to form an electronic module, fitting the enscapsulated electronic assembly into a housing shell, and securing the encapsulated module to the housing shell.

DETAILED DESCRIPTION OF THE INVENTION

Figure 1:
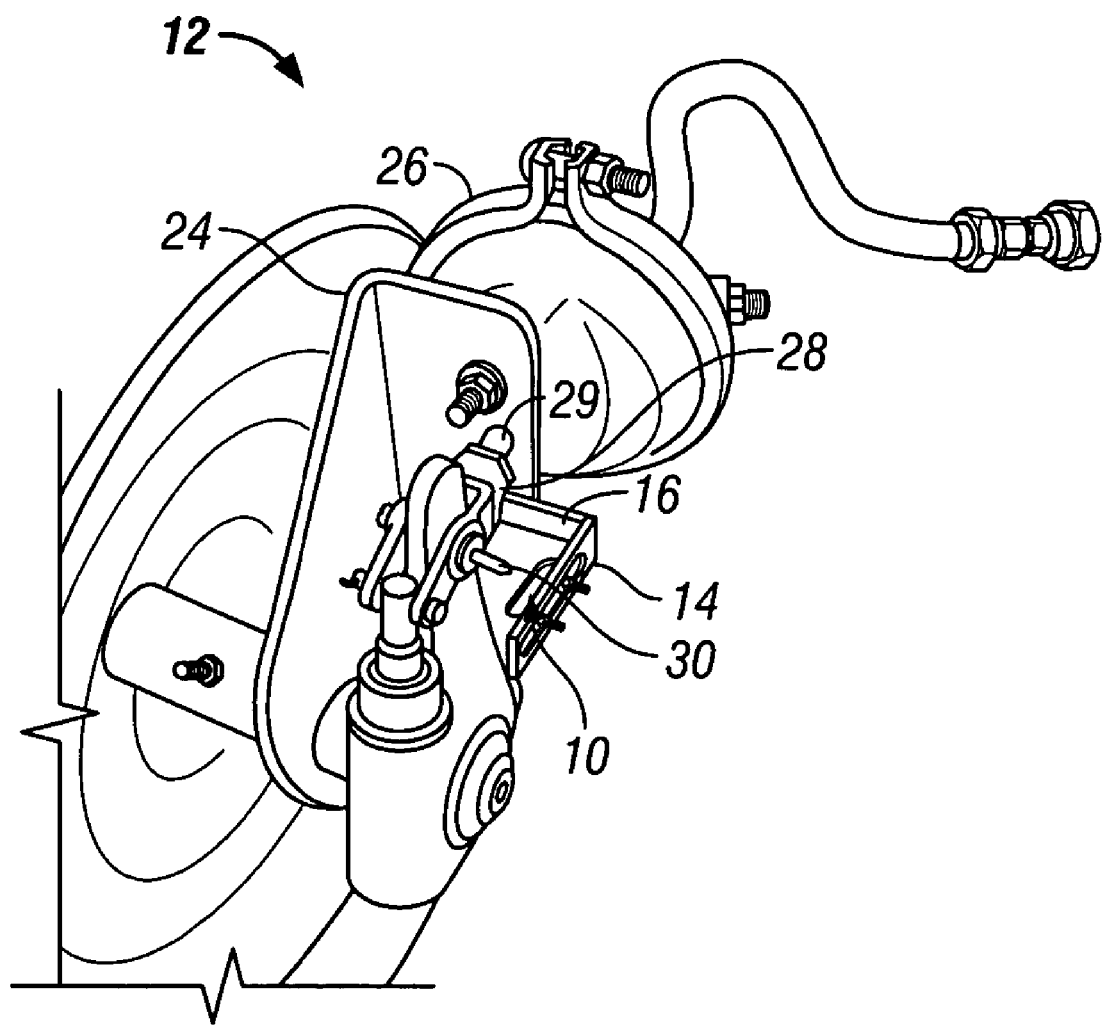
FIG. 1 is a perspective view of a brake assembly including an electronic brake stroke monitor formed in accordance with an exemplary embodiment of the present invention.

FIG. 1 illustrates a sealed electronic monitor 10 formed in accordance with an exemplary embodiment of the present invention. The electronic monitor 10, as explained below, is adapted for reliable monitoring of a brake assembly 12 despite an extreme or severe operating environment. While the invention is described in the context of a vehicle braking system monitor, it is to be understood that the following description is provided for illustrative purposes only, and is not intended to limit the invention to any particular use or application, such as with the brake assembly 12. Rather, it is understood that the principles described below with respect to packaging of the electronics is applicable to other instances of electronic installations in extreme conditions and demanding operating environments, whether in a vehicle or otherwise.

The electronic monitor 10 is mounted proximate the brake assembly 12 upon a bracket 14 having an attachment portion 16 at one end. The attachment portion 16 has a opening therethrough (not shown in FIG. 1) which allows the bracket 14 to be attached to a chamber mounting bracket 24 which supports a brake chamber 26 of the brake assembly 12. The brake chamber 26 includes a clevis assembly 28 having a clevis pin 30 and a brake arm 29.

The brake assembly 12 is a spring-assisted assembly of a known type that is commonly employed for braking of trucks, buses, and towed vehicles such as trailers. In normal braking operation, the brake arm 29 actuates the chamber 26 to apply and release brake pads (not shown) in response to an operator directed delivery and exhaust of a compressed fluid, such as air.

As the vehicle's brakes are applied over time, the brake pads are worn away, resulting in an increase in the stroke of the brake arm 29 needed to apply the necessary braking force. The stroke of the brake arm 29 can also change if the brakes are out of adjustment. Thus, the length of travel of the brake arm 29 is an indicator of brake wear or improper brake adjustment.

The stroke of the brake arm 29 is sensed by the electronic monitor 10 via movement of the clevis pin 30, which moves with the brake arm 29 during use. When the pin 30 travels a specified distance, corresponding to a predetermined brake wear condition, a signal is sent from the electronic monitor 10 to a remote location, such as an indicator positioned on the vehicle dashboard. An unacceptable brake condition may therefore be identified and the operator may respond accordingly.

The electronic monitor 10 is mounted a predetermined distance, such as about 0.25 inches in an exemplary embodiment, from the clevis pin 30. The electronic monitor 10 is oriented generally parallel to the clevis assembly 28 such that when the brake assembly 12 is in a fully released position, the clevis pin 30 sits at a predetermined location with respect to the electronic package 10. When the brake assembly 12 is applied, the clevis pin 30 moves in a direction parallel to the monitor 10, and by sensing the amount of movement of the clevis pin 30, the brake stroke may be determined as acceptable or unacceptable as described below.

Figure 2:
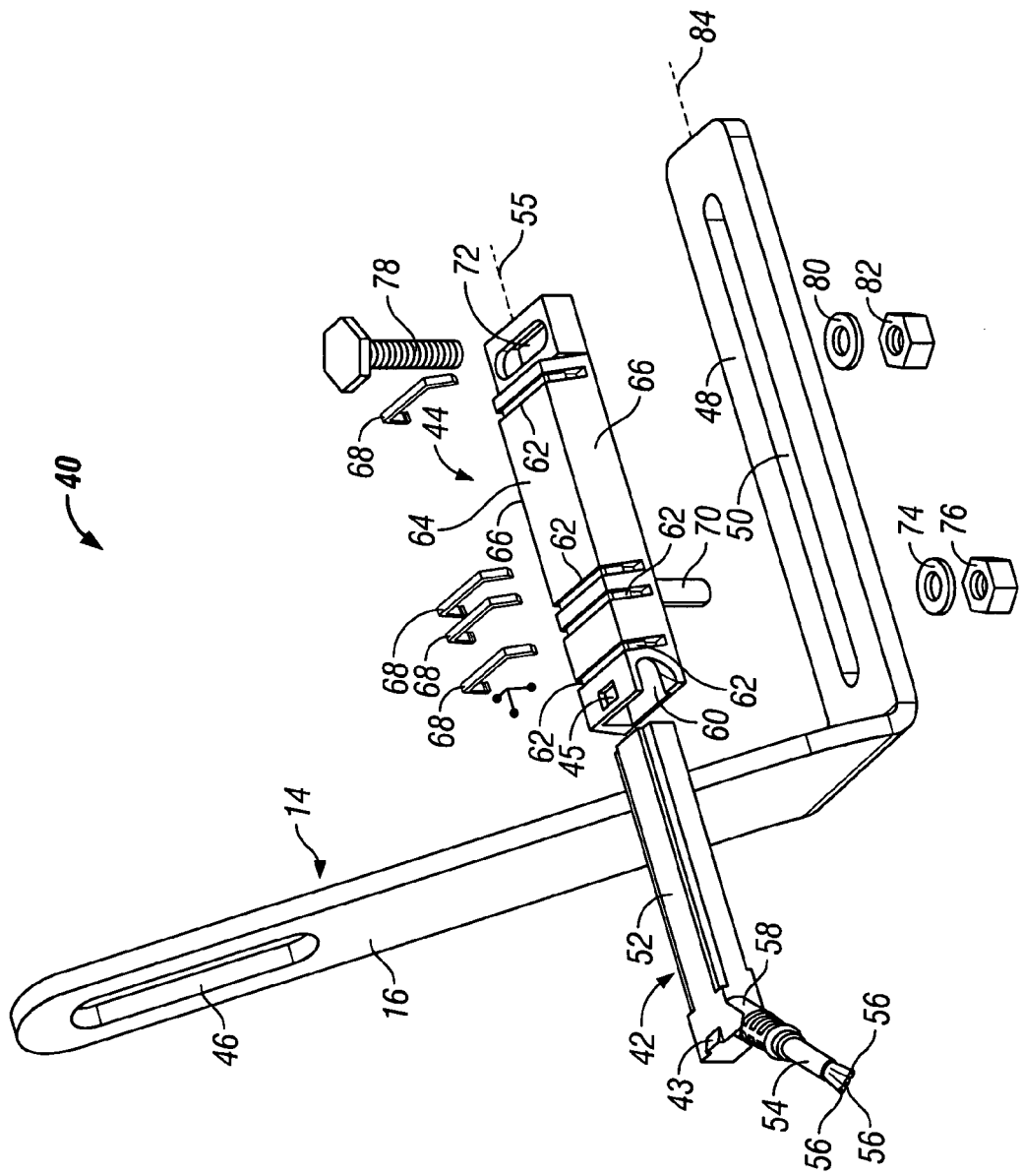
FIG. 2 is an exploded view of the brake stroke monitor shown in FIG. 1.

FIG. 2 is an exploded view of a brake stroke monitor assembly 40 including the bracket 14, a sensor module 42, and a module housing 44. The sensor module 42 and the module housing 44 collectively form an electronic package for the monitor 10 (shown in FIG. 1).

The mounting bracket 14 includes the attachment portion 16 including at least one opening 46 therethrough for mounting the attachment portion 16 to the mounting bracket 24 (shown in FIG. 1) of the brake assembly 12 (shown in FIG. 1) with a known fastener (not shown in FIG. 2). The opening 46 is elongated to provide flexibility in positioning of the bracket 14 with respect to the brake assembly 12.

A positioner portion 48 extends from the attachment portion 16 at substantially a right angle thereto, and the positioner portion 48 includes an elongated slot 50 therein which permits attachment of the sensor module 42 and the module housing 44 to the positioner portion 48. While an exemplary bracket 14 is illustrated, it is understood that a variety of differently shaped and configured brackets may also be used in further and/or alternative embodiments of the invention.

The sensor module 42 includes an electronic assembly (not shown in FIG. 2) which is embedded in a protective capsule layer 52. In an illustrative embodiment, the capsule layer 52 is a low durometer, low temperature processing material applied to the electronic assembly in a known overmolding process into a generally rectangular form completely surrounding and in intimate contact with the components of the electronic assembly. A suitable material for the capsule layer 52 is an Alcryn® melt processsible rubber commercially available from Advanced Polymer Alloys of Wilmington Del., thereby providing a relatively soft and compressible protective casing for the electronic assembly. With such a material, a mold temperature of about 300° F. may be obtained, and by gating the mold appropriately so that the material does not directly impact the electronic assembly during molding, the electronic components are not damaged by the overmolding operation. When the electronic assembly is encapsulated in the capsule layer 52 to form the sensor module 42, a slimmer profile is produced in comparison to modules having silicon potting compounds, and the sensor module 42 is completely immersible while providing a watertight enclosure for the electronic assembly. Additionally, enscapsulation of the sensor module 42 is less expensive than packing a housing with a silicon potting compound.

While one suitable material for the capsule layer 52 has been identified, it is understood that other known materials having similar properties and characteristics may likewise be employed in alternative embodiments to encapsulate the electronics of the sensor module 42.

A cable 54 exits the sensor module at one corner thereof at approximately a 45° angle with respect to the longitudinal axis 55 of the sensor module 42. In the illustrated embodiment, the cable 54 includes three conductors 56, each of which are soldered to the electronic assembly within the overmolded capsule layer 52. A portion 58 of the cable 54 stemming from the sensor module 42 is also overmolded with the capsule layer 52 to provide a strain relief to the cable exit and to prevent the conductors 56 from being separated from the electronic assembly. The cable 54 is coupled to an indicator or alarm (not shown) which alerts an operator to the status of the brake assembly 12 (shown in FIG. 1).

It is understood that in further and/or alternative embodiments greater or fewer conductors 56 may be provided in the cable 54, and that the cable 54 may exit the sensor module in an another location or another orientation with respect to the sensor module 42.

The module housing 44 is separately fabricated from the sensor module 42 and forms a comparatively hard shell, thin walled enclosure for the sensor module 42. A latch protrusion 43 is formed on one end of the sensor module 42 which engages a latch aperture 45 in the corresponding end of the module housing 44. The sensor module 42 and the module housing 44 may therefore be securely engaged or locked to one another.

In an exemplary embodiment, the module housing 42 is fabricated from a material which is chemically compatible with the capsule layer 52, and in one embodiment the module housing 42 is fabricated from magnesium according to a known thixo-molding process to form a non-magnetic enclosure for the sensor module 42. Alternatively, the module housing 44 may be fabricated according to a known molding operation with a high strength plastic, such as Minlon® mineral-reinforced nylon resin available from E. I. du Pont de Nemours and Company. It is further contemplated that other known suitable materials may be employed in the fabrication of the module housing 44.

The module housing 44 includes a substantially hollow interior or bore 60 which is shaped and dimensioned to receive and accept the encapsulated sensor module 42 when inserted therein with press-fit engagement Collectively, the encapsulated sensor module 42 and the module housing 44 provide a secure packaging for the electronics which may capable withstand severe environmental conditions encountered when mounted underneath a vehicle in proximity to the brake assembly 12 (shown in FIG. 1). The sensor module 42 provides a moisture proof, sealed enclosure which is chemically resistant to fluids and moisture encountered during use, while the module housing 44 provides an impact resistant enclosure about the sensor module 42.

A number of indicator slots 62 are formed into a top 64 and opposite sides 66 of the module housing 44. A number of U-shaped indicator bars 68 may be coupled to the indicator slots 62 with snap-fit engagement such that the indicator bars are substantially flush with the top and side surfaces 64 and 66 of the module housing 44. The plastic indicator bars 68 may be color-coded or otherwise distinguished from the module housing 44 to visibly indicate the brake stroke condition by observation of the location of the clevis pin 30 (shown in FIG. 1) with respect to the indicator bars 68. As such, the module housing 44 provides local visual indication of brake wear while the sensor module 42 provides remote indication of brake wear.

The indicator bars 68 may be selectively employed in designated indicator slots 62 to represent a plurality of acceptable brake stroke ranges between a selected pair of indicator bars 28, and thus a single module housing 44 may be used with a variety of different vehicles and braking systems. While four indicator bars are illustrated in FIG. 2, it is understood that greater or fewer numbers of indicators bars could be used to visibly indicate greater or fewer ranges of brake stroke.

The module housing 44 is fabricated with a molded-in-place threaded stud 70 in an exemplary embodiment, and an elongated opening 72 oriented transverse to the longitudinal axis 55 of the module housing 44. The threaded stud 70 is inserted through the slot 50 in the positioner portion 48 of the mounting bracket 14, and a lock washer 74 and nut 76 are fastened to the stud 70 to securely couple the module housing 44 to the positioner portion 48. A positioning bolt 78 is inserted through the opening 72 in the module housing 44 and also through the slot 50 in the positioner portion 48 of the mounting bracket 14. A lock washer 80 and nut 82 are fastened to the positioning bolt 78 to securely couple the module housing 44 to the positioner portion 48 on an end of the module housing 44.

By varying the location of the positioning bolt 78 in the transverse opening 72 in the module housing 44, the longitudinal axis 55 of the module housing 44 may be positioned at an angle with respect to a longitudinal axis 84 of the positioner portion 48 of the mounting bracket 14. The mounting bracket 14 therefore need not be precisely positioned on the brake assembly 12 (shown in FIG. 1). Rather, the position of the module housing 44 may be readily adjusted for precise positioning of the module housing 44, and hence the position of the sensor module 42, with respect to the clevis pin 30 (shown in FIG. 1). Installation of the brake monitor 10 (shown in FIG. 1) is therefore simplified.

Figure 3:
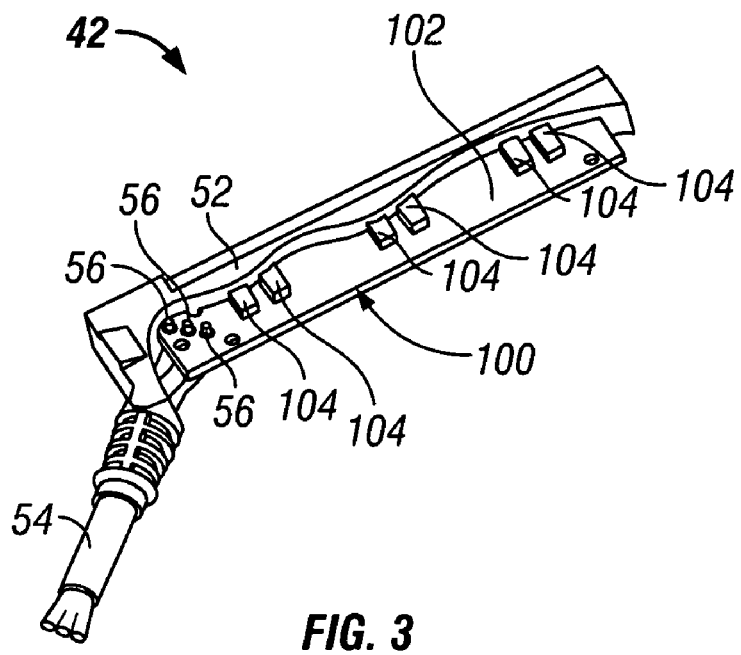
FIG. 3 is a perspective view partly broken away of a sensor module for the monitor shown in FIGS. 1 and 2.

FIG. 3 is a perspective view partly broken away of the sensor module 42 illustrating an electronic assembly 100 inside the capsule layer 52. The electronic assembly 100 includes a printed circuit board 102 and a number of sensors 104 mounted to the board 102. In an exemplary embodiment the sensors 104 are hall effect sensors and the printed circuit board 102 includes circuitry for monitoring the voltage output of the sensors 104. As the clevis pin 30 (shown in FIG. 1) moves in front of the sensor module, the voltage output from the sensors varies, thereby reflecting a relative position of the clevis pin 30 with respect to the sensors 104. In various alternative embodiments, other types of sensors and components may be employed in lieu of hall effect sensors to monitor the movement of the clevis pin 30.

As also seen in FIG. 3, the conductors 56 of the cable 54 are terminated to the printed circuit board 102. An output signal from the printed circuit board 102 may therefore be transmitted to a remote location through the cable 54.

Figure 4:
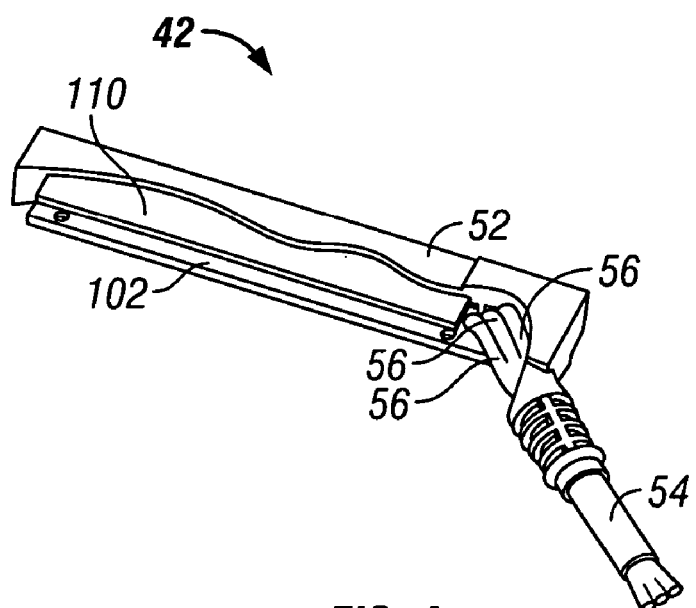
FIG. 4 is another perspective view partly broken away of the sensor module shown in FIG. 2.

FIG. 4 is another perspective view partly broken away of the sensor module 42 illustrating an opposite side of the electronic assembly 100 inside the capsule layer 52. A magnetic plate 110 is located behind the printed circuit board 102 within the capsule layer 52. The magnetic plate 110 creates a magnetic field in the vicinity of the sensor module 42. As the clevis pin 30 (shown in FIG. 1) moves within the magnetic field, voltage changes are induced in the sensors 104 (shown in FIG. 3). The printed circuit board 102 outputs signals through the conductors 56 in the cable 54 when the sensor outputs indicate a predetermined length of travel of the clevis pin 30.

Figure 5:
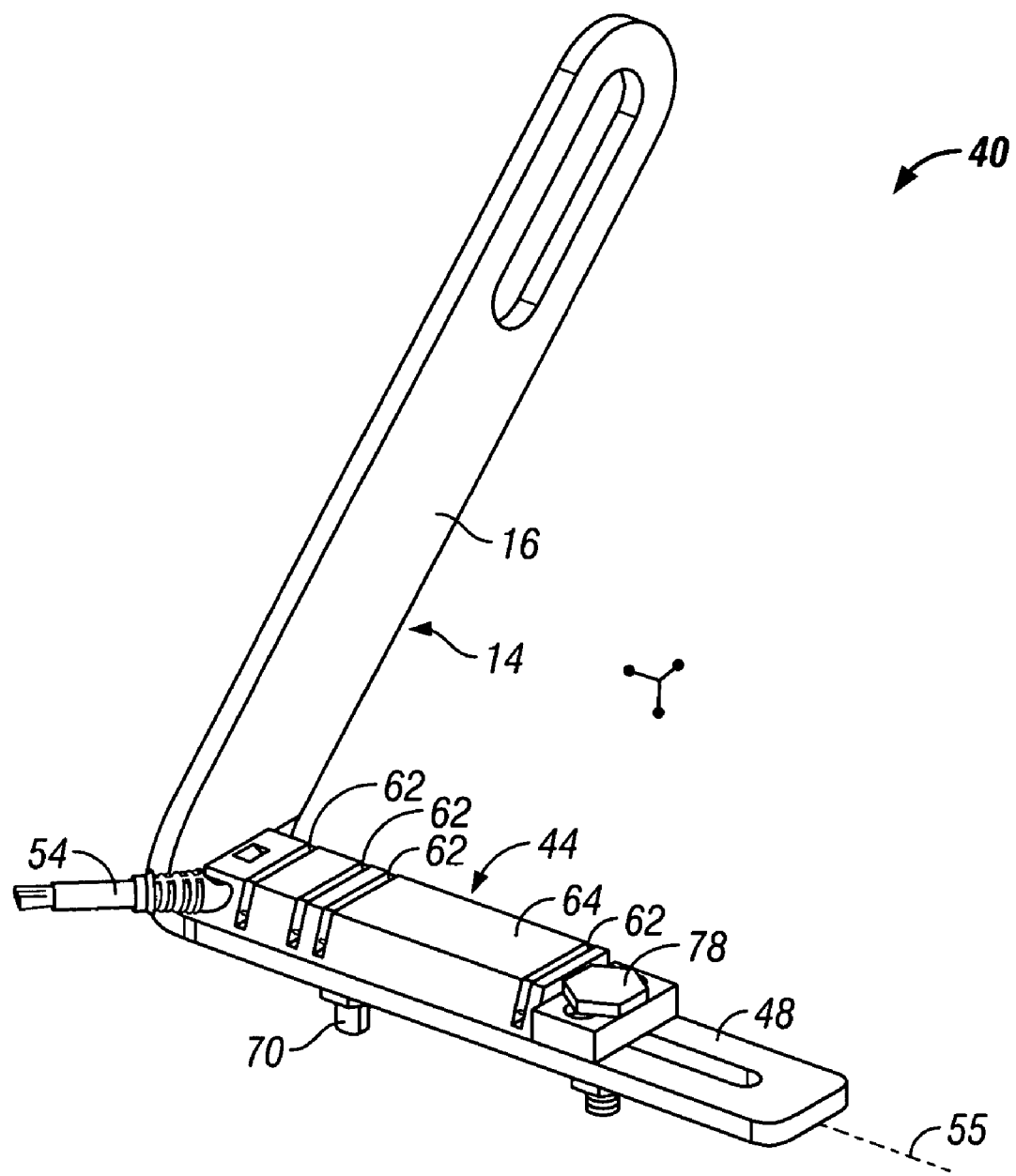
FIG. 5 is an assembly view of the brake stroke monitor shown in FIG. 2.

FIG. 5 is an assembled view of the brake stroke monitor assembly 40. The sensor module 42 (shown in FIGS. 2–4) is inserted into the module housing 44, and the module housing 44 is mounted to the positioner portion 48 of the bracket 14 via the positioning bolt 78, the stud 70 and associated fasteners. Indicator bars 68 (shown in FIG. 2) may be snapped into the indicator slots 62 as desired for visual indication of the brake stroke. The attachment portion 16 of the bracket 14 may then be mounted to the brake assembly 12 (shown in FIG. 1) and positioned such that the clevis pin 30 is positioned adjacent the top 64 of the module housing 44. The positioning bolt 78 may be adjusted so that the longitudinal axis 55 of the module housing 44 is substantially aligned with an axis of motion of the clevis pin 30. As the clevis pin 30 moves in a direction parallel to the longitudinal axis 55 of the module housing 44, the output voltage of the sensors 104 (shown in FIG. 3) in the sensor module 42 indicates the position of the pins 30 relative to the module housing 44. When the brake stroke length reaches a predetermined threshold, such as a length greater than a longitudinal distance between a selected pair of the indicator bars (shown in FIG. 2), the sensor module 42 outputs a signal through the cable 54 to alert the vehicle operator of the brake condition.

Figure 6:
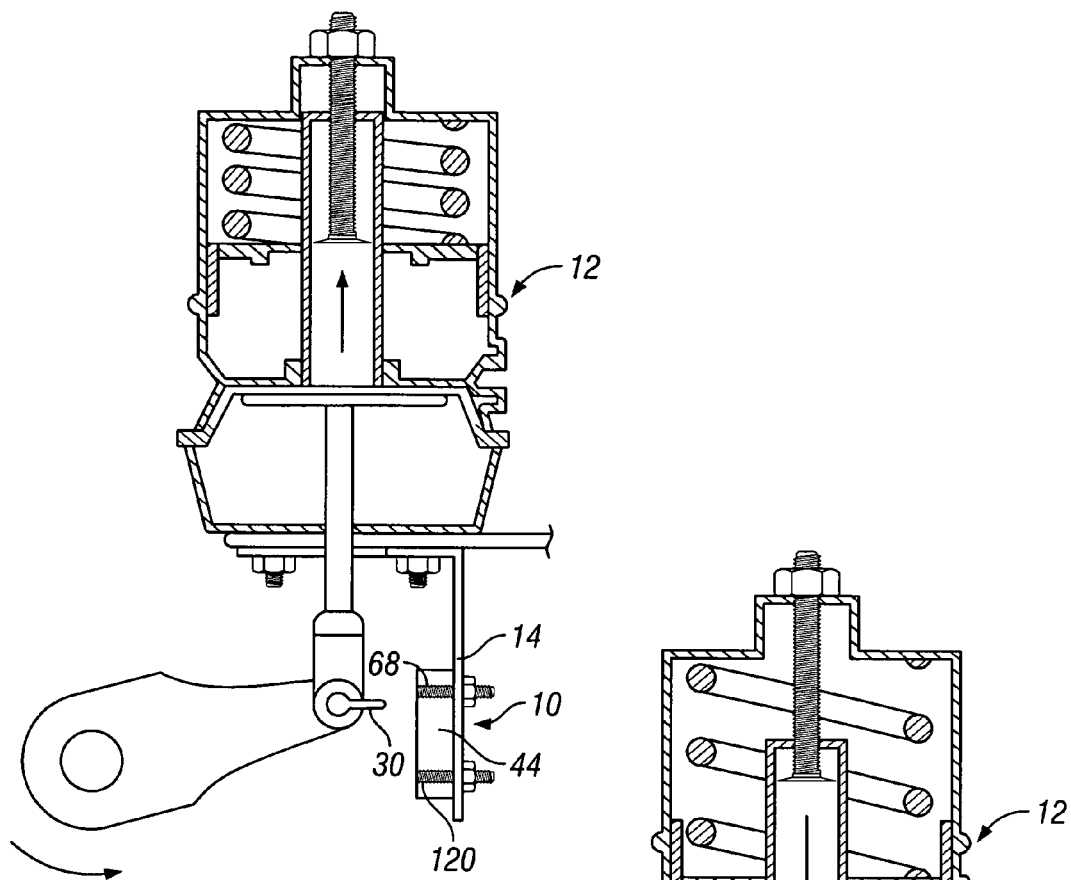
FIG. 6 is a top plan view of the brake assembly in a first position relative to the brake stroke monitor.
Figure 7:
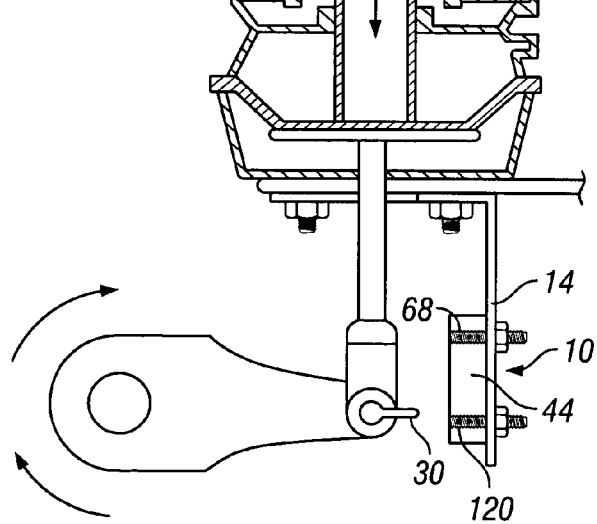
FIG. 7 is top plan view of the brake assembly in a second position relative to the brake stroke monitor.
Figure 8:
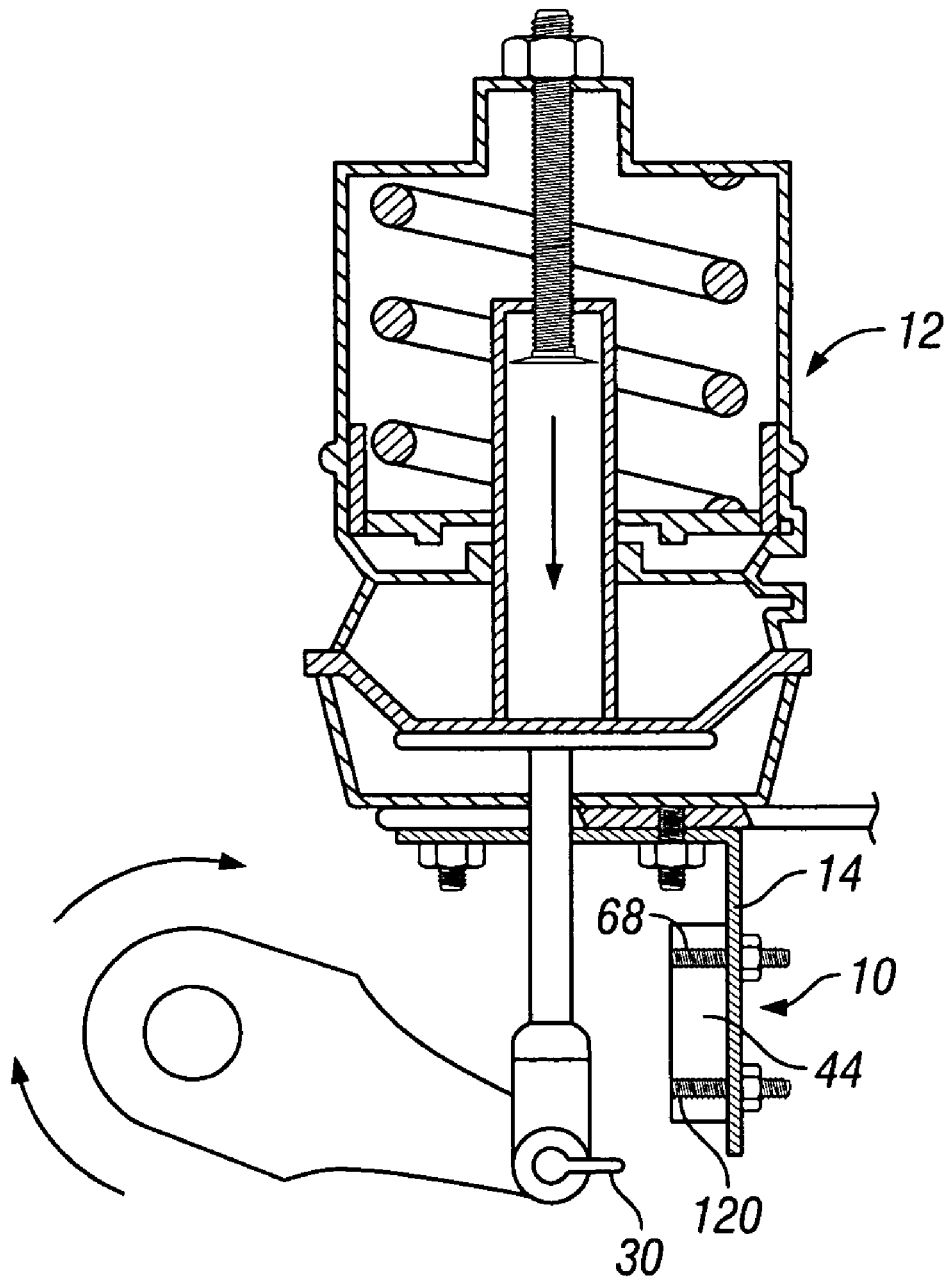
FIG. 8 is top plan view of the brake assembly in a third position relative to the brake stroke monitor.

FIG. 6–8 illustrate the brake monitor 10 at different stages or conditions of the brake assembly 12. Initially, the clevis pin 30 is orientated at a full brake position with respect to the module housing 44 at a location approximately corresponding to a first indicator bar 68 of the module housing 44. At this stage of operation, the brake pads are worn little, if any, and the brake stroke is relatively small. The sensors 104 (shown in FIG. 3) of the sensor module 42 (shown in FIGS. 2–4) produce no output, and it may be visually observed that the brakes are in good operating condition with the clevis pin 30 substantially aligned with the first indicating bar 68.

Over time, and as the brake assembly 12 is used, the brake pads wear and the brake stroke increases as illustrated in FIG. 7. The clevis pin 30 moves closer to a second indicator bar 120 that is located a predetermined distance from the first indicator bar 68 on the sensor housing, which also coincides with an acceptable brake stroke for the vehicle on which the brake monitor 10 is installed. At this stage of operation, the brake pads are moderately worn and the brake stroke is larger, but still within acceptable limits. The sensors 104 (shown in FIG. 3) of the sensor module 42 (shown in FIGS. 2–4) produce no output, and it may be visually observed that the brake assembly 12 is in an acceptable operating condition with the clevis pin 30 located between the first and second indicating bars 68 and 120.

As the brake assembly 12 continues to be applied, the brake pads wear and the brake stroke increases further as illustrated in FIG. 8. When the brakes become severely worn, the clevis pin 30 moves beyond the second indicator bar 120. At this stage of operation, the brake pads are unacceptably worn. The sensors 104 (shown in FIG. 3) of the sensor module 42 (shown in FIGS. 2–4) produce an output signal to warn the operator that the brake assembly 12 is in an unacceptable operating condition and that the brake assembly 12 should be serviced as soon as possible.

Packaging of the electronics of the break wear monitor 10 as described above ensures reliable operation of the monitor 10 despite the severe operating environment which the monitor 10 is subjected to in use near the brake assembly 12 located exterior and underneath the vehicle. Secure packaging is provided having a lower profile and lower cost than as compared to conventional electronic packages having a silicon potting compound.

While the invention has been described in terms of various specific embodiments, those skilled in the art will recognize that the invention can be practiced with modification within the spirit and scope of the claims.

What is claimed is:

1. An electronic package comprising:
   a circuit board;
   a compressible capsule layer encasing said circuit board and in intimate contact therewith, thereby forming a sealed immersible electronic module; and
   a housing receiving an outer surface of and press fit to said encapsulated electronic module and forming a protective shell around said electronic module with press fit engagement.

2. An electronic package in accordance with claim 1 wherein said circuit board includes at least one sensor coupled thereto.

3. An electronic package in accordance with claim 2 wherein said sensor is a hall effect sensor.

4. An electronic package in accordance with claim 1 wherein said compressible capsule layer comprises a melt processsible rubber.

5. An electronic package in accordance with claim 1 wherein said housing comprises a longitudinal axis and an elongated opening extending transverse to said longitudinal axis for adjusting a position of said housing.

6. An electronic package in accordance with claim 1 wherein said housing comprises a mounting stud.

7. An electronic package in accordance with claim 1, wherein said housing comprises at least one indicator bar.

8. An electronic package in accordance with claim 1 wherein one of said capsule layer and said housing comprises a latch configured to engage the other of said capsule layer and said housing.

9. An electronic package in accordance with claim 1 further comprising a magnetic plate, said magnetic plate positioned beneath said circuit board and encased in said capsule layer.

* * * * *